United States Patent
Kim et al.

(10) Patent No.: US 8,335,329 B2
(45) Date of Patent: Dec. 18, 2012

(54) PIEZOELECTRIC SPEAKER AND METHOD OF MANUFACTURING THE SAME

(75) Inventors: Hye Jin Kim, Daejeon (KR); Sung Q Lee, Daejeon (KR); Hong Yeol Lee, Cheongju (KR); Kang Ho Park, Daejeon (KR); Jong Dae Kim, Daejeon (KR); Kun Mo Koo, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 288 days.

(21) Appl. No.: 12/878,293

(22) Filed: Sep. 9, 2010

(65) Prior Publication Data
US 2011/0135123 A1    Jun. 9, 2011

(30) Foreign Application Priority Data
Dec. 8, 2009 (KR) .................. 10-2009-0120935

(51) Int. Cl.
*H04R 25/00* (2006.01)
(52) U.S. Cl. .................. 381/190; 381/191
(58) Field of Classification Search .......... 381/190, 381/191, 152, 173–176; 310/311, 313 R, 310/324; 257/245, 254
See application file for complete search history.

(56) References Cited

U.S. PATENT DOCUMENTS

| | | | |
|---|---|---|---|
| 6,427,017 B1 * | 7/2002 | Toki | 381/190 |
| 2007/0013268 A1 * | 1/2007 | Kubo et al. | 310/324 |
| 2008/0218031 A1 * | 9/2008 | Kuroda et al. | 310/334 |

FOREIGN PATENT DOCUMENTS

| | | |
|---|---|---|
| JP | 2004-147319 A | 5/2004 |
| JP | 2006-287968 A | 10/2006 |
| KR | 1020060021224 A | 3/2006 |
| KR | 1020070042756 A | 4/2007 |
| KR | 1020080110402 A | 12/2008 |
| KR | 1020090054389 A | 5/2009 |

OTHER PUBLICATIONS

Hye Jin Kim et al., "High Performance Piezoelectric Microspeakers and Thin Speaker Array System", ETRI Journal, Dec. 2009, pp. 680-687, vol. 31, No. 6, ETRI.

* cited by examiner

*Primary Examiner* — Tuan Nguyen

(57) ABSTRACT

In a piezoelectric speaker, an acoustic diaphragm is thicker than a piezoelectric thin film and is formed of a more flexible and higher elasticity material than the piezoelectric thin film, thereby greatly improving output sound pressure in a low frequency band and reducing sound distortion. Further, the piezoelectric thin film is attached to the acoustic diaphragm in an inclined structure in which the piezoelectric thin film is horizontally turned from the acoustic diaphragm, thereby preventing a standing wave from being created by structural symmetry and minimizing sound distortion.

9 Claims, 5 Drawing Sheets

PIEZOELECTRIC SPEAKER AND METHOD OF MANUFACTURING THE SAME

CROSS-REFERENCE TO RELATED APPLICATION

This application claims the benefit of Korean Patent Application No. 10-2009-0120935, filed Dec. 8, 2009, the disclosure of which is hereby incorporated herein by reference in its entirety.

BACKGROUND

1. Field of the Invention

The present invention relates to a piezoelectric speaker and a method of manufacturing the same, and more particularly, to a small piezoelectric speaker and a method of manufacturing the same that are capable of obtaining high sound pressure in a low frequency band and reducing distortion of sound.

2. Discussion of Related Art

A piezoelectric speaker has a smaller thickness, a greater weight and a lower power consumption than an existing voice coil motor (VCM)-type speaker. Accordingly, the piezoelectric speaker is widely used for small, thin and lightweight portable terminals.

Examples of a conventional piezoelectric speaker include a piezoelectric speaker with a piezoelectric vibrator, a piezoelectric speaker with a piezoelectric body, and a piezoelectric speaker with a piezoelectric film, as briefly described below.

First, in a conventional piezoelectric speaker, the piezoelectric speaker with a piezoelectric vibrator, as the piezoelectric vibrator vibrates, a diaphragm vibrates to generate sound. However, in the piezoelectric speaker having this structure, since the vibration of the piezoelectric vibrator must be delivered to the diaphragm via an elastic body for vibration delivery, the vibration of the piezoelectric vibrator must be very great and the diaphragm must be larger than the piezoelectric vibrator. Further, when the vibration is delivered, unnecessary resonance may occur, causing peak-dip of output sound pressure, and sound may be distorted, degrading sound quality.

In another conventional piezoelectric speaker, the piezoelectric speaker with a piezoelectric body attached on a metallic diaphragm, the metallic diaphragm is displaced by a signal applied to the piezoelectric body, so that sound is generated. The piezoelectric speaker having this structure can be manufactured in a smaller size than the piezoelectric speaker with a piezoelectric vibrator. However, it is difficult to reproduce sound in a low frequency band because the metallic diaphragm is thicker than the piezoelectric material. It is also difficult to embody a rich sound stage due to cool and sharp tones caused by a metal material of the metallic diaphragm. Further, since unnecessary resonance may be caused by a frame for supporting the metallic diaphragm, sound may be easily distorted.

In another conventional piezoelectric speaker, the piezoelectric speaker with a piezoelectric film such as polyvinylidene fluoride (PVDF), a conductive polymer film is formed on both sides of a thin piezoelectric film. A voltage is applied to electrodes formed around the conductive polymer film to generate sound. In this piezoelectric speaker, since a piezoelectric constant of the piezoelectric film is not great, small displacement occurs. Accordingly, the piezoelectric film must have a great size, such that the diaphragm is larger than for other conventional speakers.

It is difficult to make the conventional piezoelectric speakers in a small size because the piezoelectric speakers have large diaphragms and also to reproduce sound in a low frequency band due to their relatively thick diaphragms.

Further, in the conventional piezoelectric speakers, a standing wave is created by a structural symmetry between the piezoelectric thin film and the diaphragm, such that sound can be readily distorted.

SUMMARY OF THE INVENTION

The present invention is directed to a small piezoelectric speaker and a method of manufacturing the same that are capable of obtaining high sound pressure in a low frequency band and reducing distortion of sound.

According to one aspect of the present invention, a piezoelectric speaker includes: a piezoelectric thin film for converting an electric signal into a physical vibration signal; an upper electrode and a lower electrode formed on and beneath the piezoelectric thin film; a damping material layer formed below the piezoelectric thin film with the upper and lower electrodes formed thereon and therebeneath; an acoustic diaphragm attached to the piezoelectric thin film to have an inclined structure in which the acoustic diaphragm is horizontally turned from the piezoelectric thin film with the damping material layer interposed therebetween; and a frame for fixing the acoustic diaphragm using an adhesive material with high elasticity.

The damping material layer may be a thin film formed of a low viscosity, high elastic material to have a uniform thickness so that the piezoelectric thin film with the upper and lower electrodes formed thereon and therebeneath is attached to the acoustic diaphragm and vibration of the piezoelectric thin film is uniformly delivered to the acoustic diaphragm.

The acoustic diaphragm may have a greater thickness than the piezoelectric thin film and may be formed of a more flexible and higher elasticity material than the piezoelectric thin film. Accordingly, the acoustic diaphragm may vibrate as the piezoelectric thin film vibrates to improve output sound pressure in a low frequency band, and the acoustic diaphragm may absorb harmonic components resulting from the vibration of the piezoelectric thin film, and reflected vibration from the frame to reduce sound distortion.

In particular, the acoustic diaphragm having the inclined structure with the piezoelectric thin film may prevent a standing wave from being created by structural symmetry to reduce sound distortion. Here, the piezoelectric thin film and the acoustic diaphragm may have an inclination angle of 60° to 75°.

The adhesive material with high elasticity may absorb vibration of the acoustic diaphragm and reflected vibration from the frame to reduce sound distortion.

According to another aspect of the present invention, a method of manufacturing a piezoelectric speaker include: forming a piezoelectric thin film and then forming an upper electrode and a lower electrode on and beneath the piezoelectric thin film, respectively; forming a damping material layer for attachment of the piezoelectric thin film below the piezoelectric thin film with the upper and lower electrodes formed thereon and therebeneath; attaching the piezoelectric thin film to an acoustic diaphragm in an inclined structure in which the piezoelectric thin film is horizontally turned from the acoustic diaphragm and performing drying at room temperature; and fixing the acoustic diaphragm to a frame using an adhesive material with high elasticity.

Forming a piezoelectric thin film and then forming an upper electrode and a lower electrode may comprises polishing a piezoelectric material layer to form the piezoelectric thin film having a thickness of 10 to 60 μm Forming a piezoelectric thin film and then forming an upper electrode and a lower electrode may comprises forming the upper and lower electrodes by depositing titanium (Ti) and then depositing any one of gold (Au), silver (Ag), platinum (Pt), aluminum (Al) and copper (Cu) to reduce interfacial resistance with the piezoelectric thin film.

Forming a damping material layer may comprises forming the damping Immaterial layer as a thin film having a uniform thickness using a low viscosity, high elastic material.

Before attaching the piezoelectric thin film to an acoustic diaphragm may forming the acoustic diaphragm of a more flexible and higher elasticity material than the piezoelectric thin film to a greater thickness than the piezoelectric thin film so that the acoustic diaphragm can absorb harmonic components resulting from vibration of the piezoelectric thin film, and reflected vibration from the frame while vibrating as the piezoelectric thin film vibrates.

Attaching the piezoelectric thin film to an acoustic diaphragm may comprises attaching the piezoelectric thin film to the acoustic diaphragm in an inclined structure to prevent a standing wave created by structural symmetry.

Attaching the piezoelectric thin film to an acoustic diaphragm may comprises attaching the piezoelectric thin film to the acoustic diaphragm at an inclination angle of 60° to 75° with the acoustic diaphragm.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

First Exemplary Embodiment

Figure 1A:
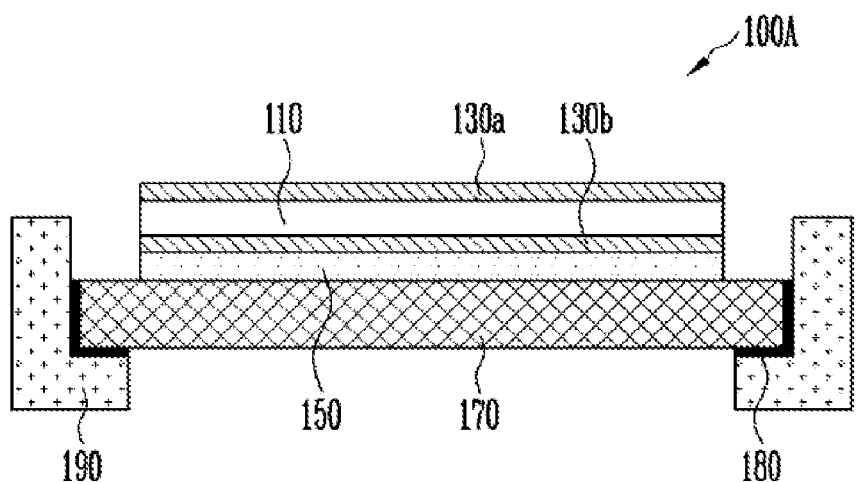
FIGS. 1A and 1B illustrate a piezoelectric speaker according to a first exemplary embodiment of the present invention
Figure 1B:
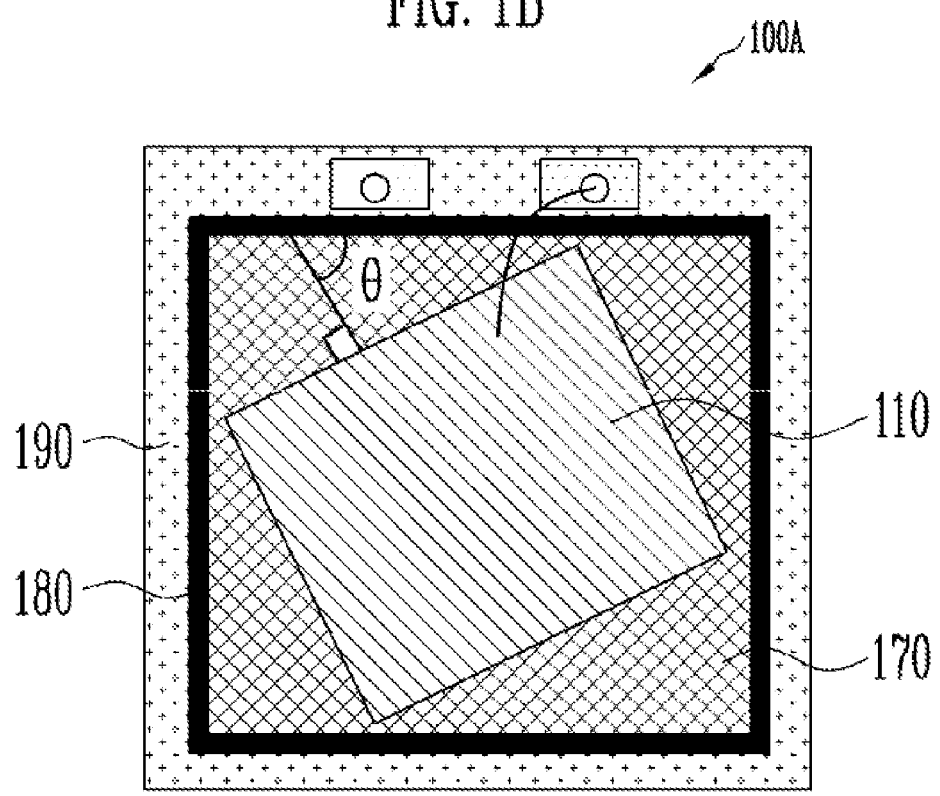

FIGS. 1A and 1B illustrate a piezoelectric speaker 100A according to a first exemplary embodiment of the present invention.

Referring to FIGS. 1A and 1B, the piezoelectric speaker 100A according to the first exemplary embodiment of the present invention includes a piezoelectric thin film 110 for converting an electric signal into a physical vibration signal, an upper electrode 130a and a lower electrode 130b formed on and beneath the piezoelectric thin film 110, respectively, a damping material layer 150 formed below the piezoelectric thin film 110 with the upper and lower electrodes formed thereon and therebeneath, an acoustic diaphragm 170 attached to the piezoelectric thin film 110 in an inclined structure with the damping material layer 150 interposed therebetween, and a frame 190 for fixing the acoustic diaphragm 170 using an adhesive material 180 with high elasticity.

The piezoelectric thin film 110 may be formed of a polycrystalline ceramic material such as lead zirconate titanate (PZT), a single crystalline thin film such as PMN-PT, PZN-PT, PYN-PT, or PIN-PT, or a polymer such as PVDF to a thickness of about 10 to 60 µm.

The upper electrode 130a and the lower electrode 130b may be connected to external terminals (not shown) for applying a voltage, and may have a thickness of about 0.2 to 0.3 µm.

The damping material layer 150 is a thin film that is formed of a high elastic material having low viscosity and has a uniform thickness, and serves to attach the piezoelectric thin film 110 to the acoustic diaphragm 170 without a separate adhesive. The damping material layer 150 also serves to prevent sound from being distorted due to a thickness deviation of a membrane of the piezoelectric speaker and rapidly and uniformly deliver the vibration of the piezoelectric thin film 110 to the acoustic diaphragm 170.

The acoustic diaphragm 170 may be formed of a more flexible and higher elasticity material (e.g., synthetic resin or rubber) than the piezoelectric thin film 110 to a greater thickness (e.g., 0.1 mm to 1 mm) than the piezoelectric thin film 110.

As the acoustic diaphragm 170 is formed of a more flexible and higher elasticity material than the piezoelectric thin film 110 to a greater thickness than the piezoelectric thin film 110, the acoustic diaphragm 170 vibrates as the piezoelectric thin film 110 vibrates, such that the first-order resonant frequency of the speaker becomes lower and high output sound pressure can be obtained even in a low frequency band. Further, the acoustic diaphragm 170 can absorb harmonic components resulting from the vibration of the piezoelectric thin film 110, and reflected vibration from the frame 190, thereby minimizing distortion of the sound.

In particular, the acoustic diaphragm 170 has a structure in which the acoustic diaphragm 170 is horizontally turned from the piezoelectric thin film 110 with the damping material layer 150 interposed therebetween.

In other words, as shown in FIG. 1B, the piezoelectric thin film 110 is horizontally turned from the acoustic diaphragm 170 to have uniform stress at four vertices of the frame 190 while avoiding vertical and lateral structural symmetry of the speaker, such that the piezoelectric thin film 110 and the acoustic diaphragm 170 have an inclined structure.

Here, the piezoelectric thin film 110 and the acoustic diaphragm 170 may have an inclination angle $\alpha$ ($45°<\alpha<90°$) to avoid the structural symmetry of the speaker. Ideally, the piezoelectric thin film 110 and the acoustic diaphragm 170 may have the inclination angle of 60 to 75°.

As the piezoelectric thin film 110 and the acoustic diaphragm 170 have the inclined structure, distortion vibration occurring in the piezoelectric thin film 110 is absorbed by the acoustic diaphragm 170 such that a standing wave is not created. Thus, the sound distortion can be reduced and the sound quality can be improved.

At least one side of the acoustic diaphragm 170 is fixed to the frame 190 by the adhesive material 180 with high elasticity. Here, the frame 190 may be formed of a material having high mechanical strength, excellent thermal resistance, electrical insulating property and impact resistance, and a very small dimensional change, such as polybutylene terephthalate (PBT), polyacetal (POM) or polycarbonate (PC), to a thickness of 2 mm or less.

The adhesive material 180 with high elasticity may serve not only to fix the acoustic diaphragm 170 to the frame 190, but also to reduce the sound distortion by absorbing the vibration of the acoustic diaphragm 170 and the reflected vibration from the frame 190.

Although the respective components of the piezoelectric speaker are rectangular in the present exemplary embodiment as described above, these components may be of any shape, including a circle or an oval, if necessary.

FIGS. 2A to 2E illustrate a process of manufacturing the piezoelectric speaker 100A according to the first exemplary embodiment of the present invention.

Figure 2A:
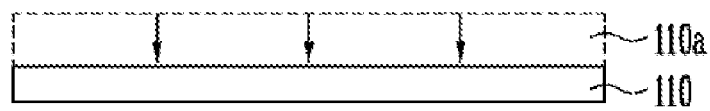
FIGS. 2A to 2E illustrate a process of manufacturing the piezoelectric speaker according to the first exemplary embodiment of the present invention.

First, as shown in FIG. 2A, a thick piezoelectric material layer 110a is lapped and polished through a polishing process to form a piezoelectric thin film 110.

In this case, a depositing process or a coating process may be applied according to a piezoelectric material of the piezoelectric material layer 110a.

As the piezoelectric thin film 110 becomes thinner, higher output sound pressure may be obtained. However, the piezoelectric thin film 110 may have a thickness of about 10 to 60 μm to reduce a sound distortion phenomenon caused when the piezoelectric thin film 110 is twisted.

Figure 2B:
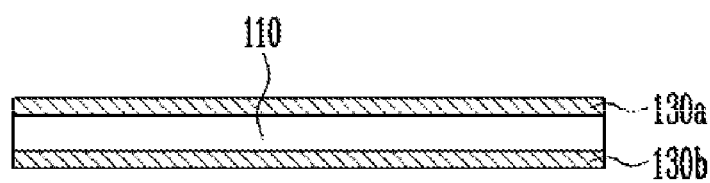

As shown in FIG. 2B, an upper electrode 130a and a lower electrode 130b are then formed on and beneath the piezoelectric thin film 110, respectively.

Here, the upper electrode 130a and the lower electrode 130b may be formed by depositing titanium (Ti) to a very small thickness and then depositing gold (Au), silver (Ag), platinum (Pt), aluminum (Al), copper (Cu), or the like to reduce interfacial resistance with the piezoelectric thin film 110.

Figure 2C:
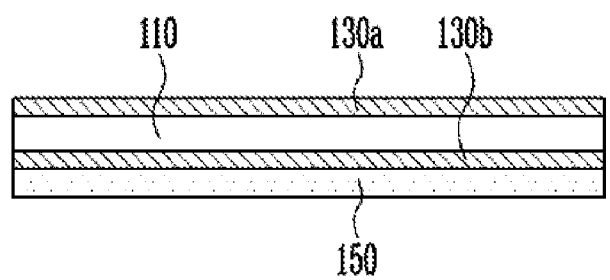

As shown in FIG. 2C, a damping material layer 150 is then formed beneath the lower electrode 130b using spin coating.

Here, the damping material layer 150 may be a thin film formed of a low viscosity, high elastic material having viscosity as low as 110 to 200 cps and high elasticity (e.g., synthetic resin or rubber) to have a uniform thickness. For example, the damping material layer 150 is formed to a thickness equal to or smaller than the piezoelectric thin film 110.

As the damping material layer 150 is the thin film formed of a low viscosity, high elastic material to have a uniform thickness as described above, the piezoelectric thin film 110 with the upper and lower electrodes formed thereon and therebeneath can be attached to the acoustic diaphragm 170 without a separate adhesive, and the vibration of the piezoelectric thin film 110 can be rapidly and uniformly delivered to the acoustic diaphragm 170.

Figure 2D:
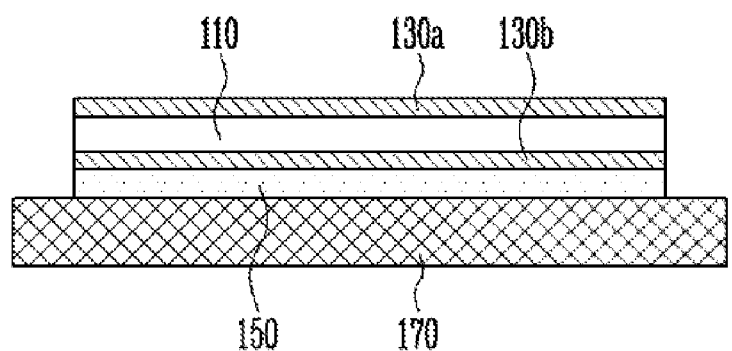

As shown in FIG. 2D, the piezoelectric thin film 110 with the damping material layer 150 formed therebelow is then attached to the acoustic diaphragm 170.

In this case, the piezoelectric thin film 110 is attached to the acoustic diaphragm 170 in an inclined structure in which the piezoelectric thin film 110 is horizontally turned from the acoustic diaphragm 170.

Here, the acoustic diaphragm 170 may be thicker than the piezoelectric thin film 110 and be formed of a more flexible and higher elasticity material than the piezoelectric thin film 110.

When a predetermined time lapses after the acoustic diaphragm 170 is attached below the damping material layer 150, the damping material layer 150 is dried at room temperature, such that the piezoelectric thin film 110 and the acoustic diaphragm 170 are tightly adhered in the inclined structure with the damping material layer 150 interposed therebetween. Thus, since the piezoelectric thin film 110 and the acoustic diaphragm 170 are adhered through a room temperature process, the method is advantageous in terms of a manufacturing process.

Although not shown, a hole may be formed in the acoustic diaphragm 170 so that the upper electrode 130a and the lower electrode 130b are connected to the external terminals through the hole of the acoustic diaphragm 170 after the damping material layer 150 is completely dried.

Figure 2E:
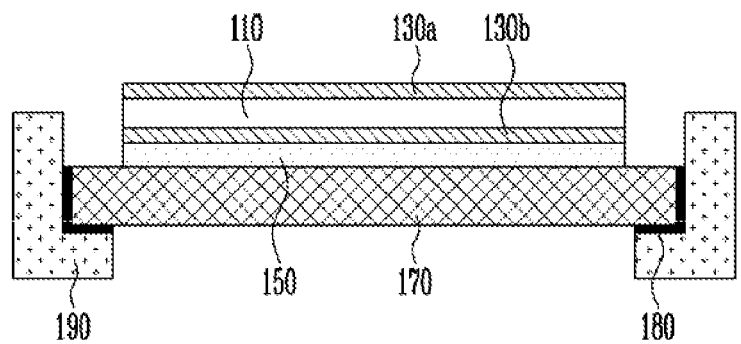

As shown in FIG. 2E, the acoustic diaphragm 170 is then fixed to the frame 190 using an adhesive material 180 with high elasticity.

Here, the adhesive material 180 with high elasticity may have low viscosity to realize uniform adhesion between the acoustic diaphragm 170 and the frame 190 and may have high elasticity to effectively absorb the vibration of the acoustic diaphragm 170 when the vibration is delivered to the frame 190 and suppress the reflected vibration from the frame 190.

Figure 3A:
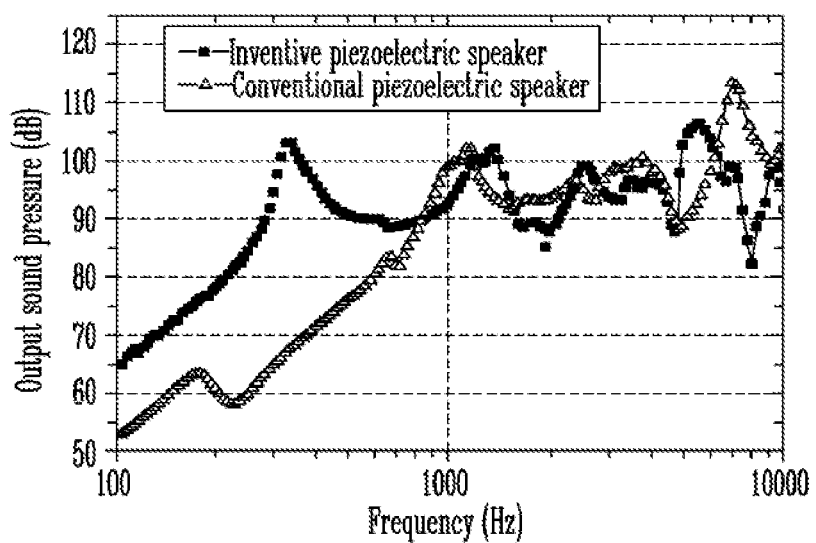
FIGS. 3A to 3C illustrate output sound pressure, vibration (amplitude), and total harmonic distortion properties of the piezoelectric speaker of the present invention.
Figure 3B:
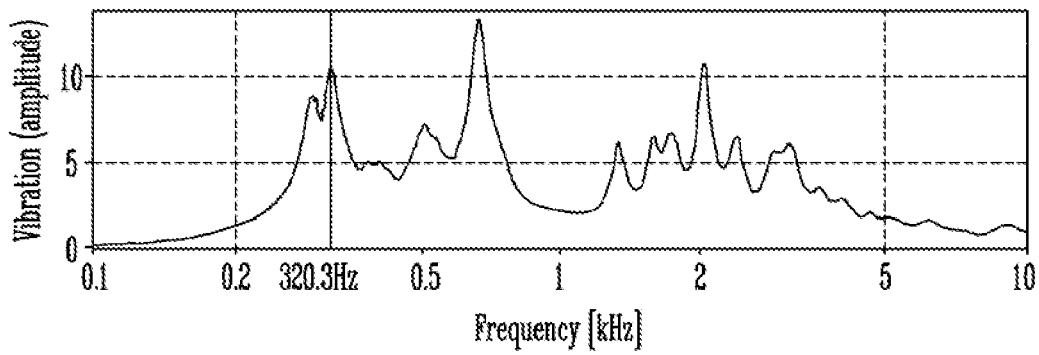
Figure 3C:
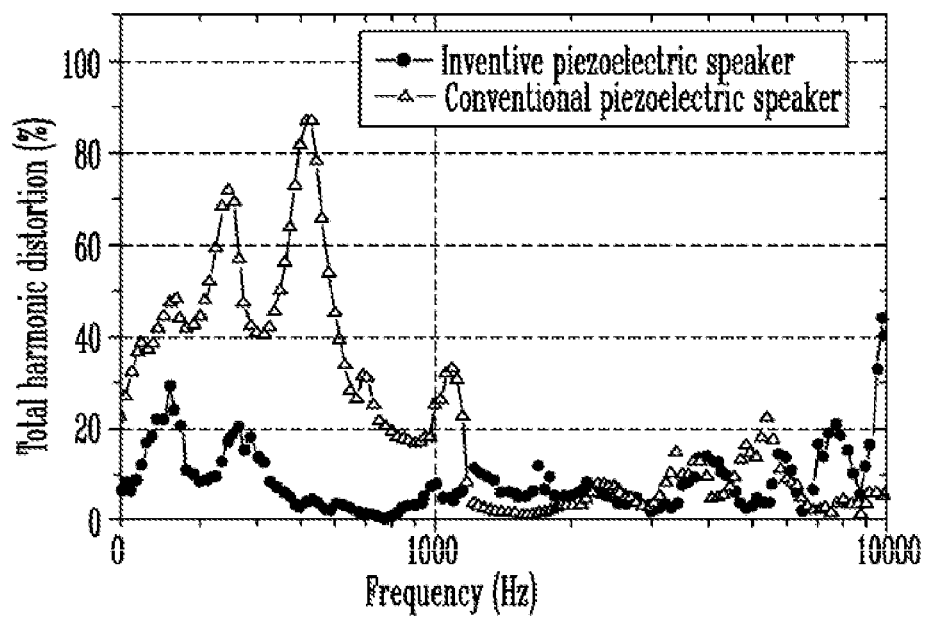

FIGS. 3A to 3C illustrate output sound pressure, vibration (amplitude), and total harmonic distortion properties of the piezoelectric speaker of the present invention, in which properties of the piezoelectric speaker having a total size, including the frame, of 22×22 $mm^2$ and a thickness of 1 mm were measured.

As shown in FIG. 3A, the piezoelectric speaker of the present invention provides a much higher output sound pressure even in a low frequency band than a conventional piezoelectric speaker, thereby reproducing rich sound.

As shown in FIG. 3B, the piezoelectric speaker of the present invention has the first-order resonant frequency as low as 320.3 Hz, thereby providing greatly improved output sound pressure in a low frequency band.

As shown in FIG. 3C, the piezoelectric speaker of the present invention exhibits low sound distortion irrespective of a frequency, making it possible to provide a much more excellent sound quality than a conventional piezoelectric speaker having the same size.

In particular, a conventional piezoelectric speaker does not provide sufficient sound pressure in a low frequency band and also exhibits high sound distortion, thereby outputting stifling and sharp sound, which makes it difficult to implement the piezoelectric speaker in commercial products. On the other hand, the piezoelectric speaker according to the present invention can provide greatly improved sound pressure in a low frequency band and enhanced sound quality, thereby outputting cool and rich sound.

Thus, the piezoelectric speaker according to the present invention 100A can have the greatly improved output sound pressure in the low frequency band through the acoustic diaphragm 170 of a more flexible, thicker and higher elasticity material than the piezoelectric thin film 110. Further, the vibration occurring in the piezoelectric thin film 110 is absorbed by the acoustic diaphragm 170 having the inclined structure with the piezoelectric thin film 110, thereby reducing the sound distortion and greatly enhancing the sound quality.

Structural asymmetry is achieved through the inclined structure of the piezoelectric thin film 110 and the acoustic diaphragm 170, thereby preventing a standing wave from being created by structural symmetry and further enhancing the sound quality.

Thus, according to the present invention, it is possible to embody a piezoelectric speaker having a small size and providing improved output sound pressure in the low frequency band and enhanced sound quality, unlike a conventional piezoelectric speaker having the same size.

Second Exemplary Embodiment

Figure 4:
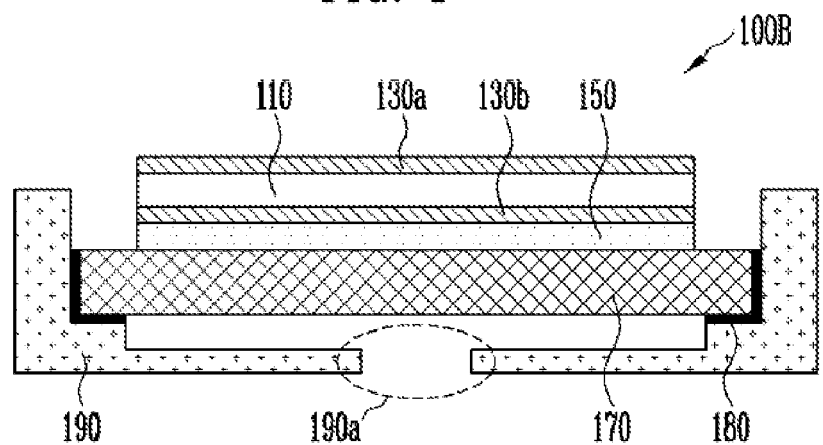
FIG. 4 illustrates a piezoelectric speaker according to a second exemplary embodiment of the present invention.

FIG. 4 illustrates a piezoelectric speaker 100B according to a second exemplary embodiment of the present invention.

Referring to FIG. 4, the piezoelectric speaker 100B according to the second exemplary embodiment of the present invention has the same structure as the piezoelectric speaker 100A shown in FIG. 1A except that a rear acoustic hole 190a of about 1 to 2 mm is formed at a center of the frame 190.

To form the rear acoustic hole 190a, the frame 190 may have a predetermined interval from the acoustic diaphragm 170 and have a thickness of 1.5 to 2 mm while surrounding a membrane of the speaker.

The rear acoustic hole 190a is provided to adjust damping when the acoustic diaphragm 170 vibrates. A peak-dip phenomenon often occurring in the piezoelectric speaker can be mitigated by adjusting the damping of the acoustic diaphragm 170 through the rear acoustic hole 190a and a soft tone can be provided by correcting flat output sound pressure in an entire frequency band. Thus, the piezoelectric speaker 100B having such a structure can provide a richer low-pitched sound and excellent sound quality, unlike a conventional piezoelectric speaker.

Third Exemplary Embodiment

Figure 5A:
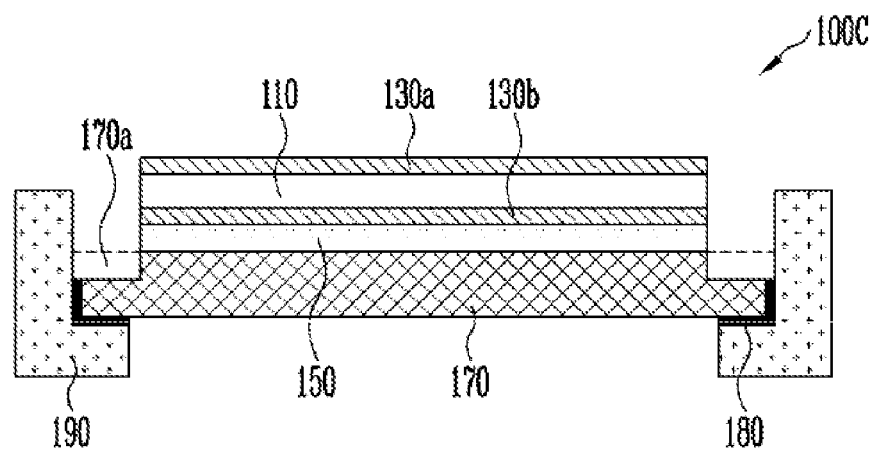
FIGS. 5A and 5B illustrate a piezoelectric speaker according to a third exemplary embodiment of the present invention.
Figure 5B:
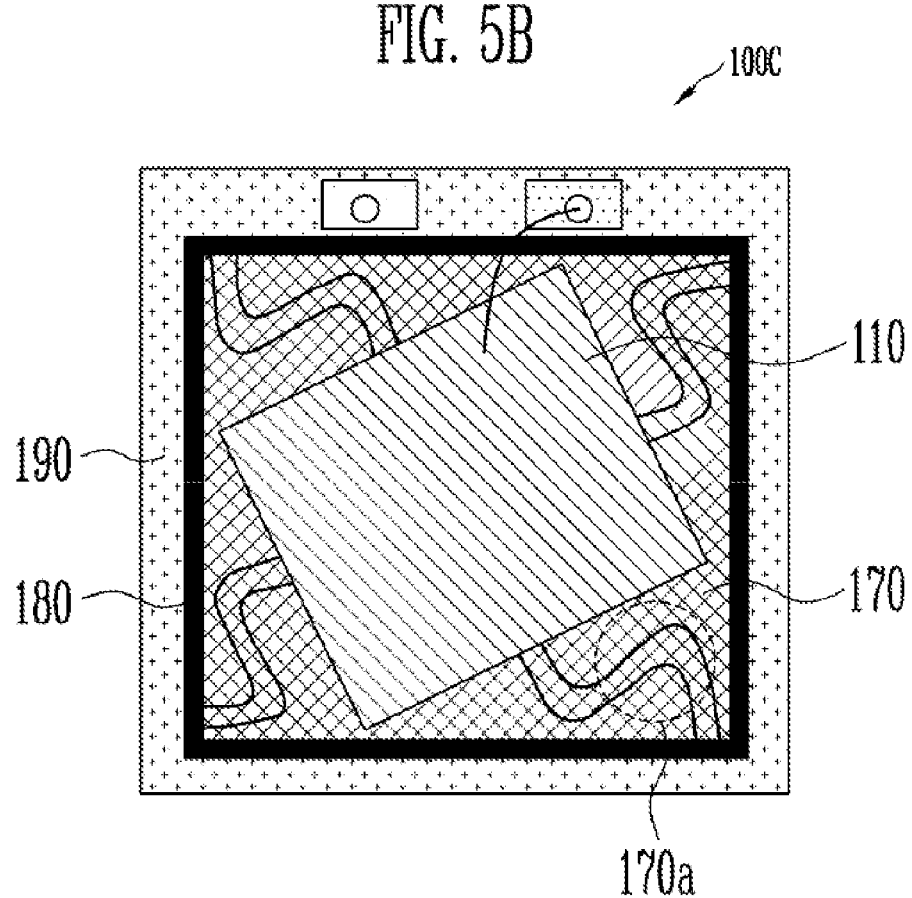

FIGS. 5A and 5B illustrate a piezoelectric speaker 100C according to a third exemplary embodiment of the present invention.

Referring to FIGS. 5A and 5B, the piezoelectric speaker 100C according to the third exemplary embodiment of the present invention has the same structure as the piezoelectric speaker 100A shown in FIG. 1A except that a high elastic acoustic diaphragm 170 is etched and shaped in a predetermined pattern to form a groove 170a.

The groove 170a of the acoustic diaphragm 170 serves as a spring so that the acoustic diaphragm 170 can vibrate more flexibly, thereby further reinforcing the output sound pressure of the speaker.

As described above, in the piezoelectric speaker according to the present invention, the acoustic diaphragm 170 is thicker than the piezoelectric thin film 110 and is formed of a more flexible and higher elasticity material than the piezoelectric thin film 110, and the piezoelectric thin film 110 is attached to the acoustic diaphragm 170 in the inclined structure. Thus, the piezoelectric speaker can have a small size, provide the greatly improved output sound pressure in the low frequency band, and reduce the sound distortion for high sound quality.

Thus, according to the present invention, it is possible to resolve problems with a conventional piezoelectric speaker, such as low output sound pressure in a low frequency band and low sound quality due to sound distortion and to embody a piezoelectric speaker having a small size and thickness and capable of providing a rich and cool sound stage and excellent sound quality.

According to the present invention, an acoustic diaphragm of a piezoelectric speaker is thicker than the piezoelectric thin film and is formed of a more flexible and higher elastic material than the piezoelectric thin film, thereby greatly improving output sound pressure in a low frequency band and reducing the sound distortion.

Furthermore, in the piezoelectric speaker according to the present invention, the piezoelectric thin film and the acoustic diaphragm are attached in the inclined structure in which the piezoelectric thin film is horizontally turned from the acoustic diaphragm, thereby preventing a standing wave from being created due to structural symmetry and minimizing the sound distortion for high sound quality.

Thus, according to the present invention, it is possible to embody a piezoelectric speaker having a small size and providing improved output sound pressure in the low frequency band and high sound quality, unlike a conventional piezoelectric speaker having the same size.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A piezoelectric speaker comprising:
    a piezoelectric thin film for converting an electric signal into a physical vibration signal;
    an upper electrode and a lower electrode formed on and beneath the piezoelectric thin film;
    a damping material layer formed below the piezoelectric thin film with the upper and lower electrodes formed thereon and therebeneath;
    an acoustic diaphragm attached to the piezoelectric thin film to have an inclined structure in which the acoustic diaphragm is horizontally turned from the piezoelectric thin film with the damping material layer interposed therebetween; and
    a frame for fixing the acoustic diaphragm using an adhesive material with high elasticity.

2. The piezoelectric speaker of claim 1, wherein the damping material layer is a thin film formed of a low viscosity, high elastic material to have a uniform thickness so that the piezoelectric thin film with the upper and lower electrodes formed thereon and therebeneath is attached to the acoustic diaphragm and vibration of the piezoelectric thin film is uniformly delivered to the acoustic diaphragm.

3. The piezoelectric speaker of claim 1, wherein the acoustic diaphragm has a greater thickness than the piezoelectric thin film and is formed of a more flexible and higher elasticity material than the piezoelectric thin film.

4. The piezoelectric speaker of claim 3, wherein the acoustic diaphragm vibrates as the piezoelectric thin film vibrates to improve output sound pressure in a low frequency band, and the acoustic diaphragm absorbs harmonic components resulting from the vibration of the piezoelectric thin film, and reflected vibration from the frame to reduce sound distortion.

5. The piezoelectric speaker of claim 3, wherein the acoustic diaphragm having the inclined structure with the piezoelectric thin film prevents a standing wave from being created by structural symmetry to reduce sound distortion.

6. The piezoelectric speaker of claim 5, wherein the piezoelectric thin film and the acoustic diaphragm have an inclination angle of 60° to 75°.

7. The piezoelectric speaker of claim 1, wherein the adhesive material with high elasticity absorbs vibration of the acoustic diaphragm and reflected vibration from the frame to reduce sound distortion.

8. The piezoelectric speaker of claim 1, wherein the frame has a rear acoustic hole formed at a center thereof to adjust damping of the acoustic diaphragm.

9. The piezoelectric speaker of claim 1, wherein the acoustic diaphragm has a groove serving as a spring so that the acoustic diaphragm flexibly vibrates.

* * * * *